United States Patent [19]
Wong

[11] Patent Number: 5,726,995
[45] Date of Patent: Mar. 10, 1998

[54] METHOD AND APPARATUS FOR SELECTING MODES OF AN INTERGRATED CIRCUIT

[75] Inventor: Keng L. Wong, Portland, Oreg.

[73] Assignee: Intel Corporation, Santa Clara, Calif.

[21] Appl. No.: 356,157

[22] Filed: Dec. 15, 1994

[51] Int. Cl.$^6$ .................................................. G01R 31/28
[52] U.S. Cl. ..................... 371/22.1; 371/22.3; 324/73 R
[58] Field of Search ........................... 371/22.1, 22.3, 371/15.1, 22.5, 22.2, 20.4; 324/158 R, 73 R, 73.1; 365/201

[56] References Cited

U.S. PATENT DOCUMENTS

| | | | |
|---|---|---|---|
| 4,847,839 | 7/1989 | Hudson et al. | 371/25 |
| 4,975,641 | 12/1990 | Tanaka et al. | 324/158 R |
| 5,103,167 | 4/1992 | Okano et al. | 324/158 R |
| 5,148,434 | 9/1992 | Richardson | 371/20.1 |
| 5,309,445 | 5/1994 | Bartels | 371/164 |
| 5,339,320 | 8/1994 | Fandrich et al. | 371/22.1 |
| 5,379,300 | 1/1995 | Yamahata et al. | 371/15.1 |
| 5,485,473 | 1/1996 | Diebold et al. | 371/22.1 |

OTHER PUBLICATIONS

IEEE Standard Test Access Port and Boundary scan Architecture, Std 1149.1, Feb. 1990.
*IEEE Standard Test Access Port and Boundary–Scan Architecture*, IEEE Std 1149.1—1990, IEEE, Inc. (Oct. 21, 1993), pp. i–xvii; 1–1—1–5;2–1—2–6;3–1—3–9;4–1—4–3;5–1—5–16;6–1—6–4;7–1—7–28;8–1—8–7.

*Standards Project, Extended Digital Serial Sheet*, P1149.2/D0.4, Test Technology Technical Committee of the IEEE Computer Society, pp. 1–1 through B–1, (Sep. 1992).

*Primary Examiner*—Robert W. Beausoliel, Jr.
*Assistant Examiner*—Nadeem Iqbal
*Attorney, Agent, or Firm*—Blakely, Sokoloff, Taylor & Zafman

[57] ABSTRACT

A method and apparatus for selecting test modes of an integrated circuit is provided. According to one aspect of the invention, a serial stream of digital signals comprising a number of predetermined patterns is applied to the integrated circuit. The integrated circuit identifies the patterns in the serial stream of digital signals and selects the test modes based upon the identified patterns. According to another aspect of the present invention, the patterns each contain n bits and are selected such that when transitioning from one of the patterns to another of the patterns in the serial stream of bits none the patterns are present in an n bit window. According to another aspect of the present invention, each occurrence of each pattern in the serial stream of bits is immediately preceded and followed by an inactive pattern. According to another aspect of the present invention, the test modes are also selected based upon the mode the integrated circuit is currently operating in.

21 Claims, 5 Drawing Sheets

METHOD AND APPARATUS FOR SELECTING MODES OF AN INTERGRATED CIRCUIT

BACKGROUND OF THE INVENTION

1. Field of the Invention

The present invention relates to the field of integrated circuit design. More specifically, the present invention relates to the testing of integrated circuits.

2. Background Information

One method of testing an integrated circuit is performed after the integrated circuit has been packaged. This type of testing is commonly referred to as external testing and is normally performed by placing the packaged integrated circuit in a testing machine. The testing machine asserts a series of test signals on the input terminals of the chip's package and determines if the chip generates the appropriate outputs on the output terminals of its package. For simple chip designs it is a simple matter to test the chip as a whole. However, this approach is not efficient for a complex chip with a large number of potential states such as a microprocessor. To provide for increased testability during external testing of a complex chip, special circuits (referred to herein as "test circuits") are built-in the chip that allow it to operate in various test modes rather that its normal operating mode. Each test circuit may be implemented to improve testability of the chip in a variety of ways. For example, a test circuit may improve testability by allowing for the separate testing of a portion of the chip. As another example, a test circuit may improve testability by allowing for the testing of the chip under special testing conditions (e.g., disabling a portion of the chip that does not function properly below a certain clock frequency and enabling a different circuit that does). The term "normal operating mode" is used to refer to the configuration of circuitry for normal operation, while the term "test modes" is used herein to refer to those configurations of circuitry which include one or more test circuits. The term "mode" is used herein to refer generally to any selectable configuration of circuitry on a chip. (It is worthwhile to note that a string of bits is read from left to right in this application).

One prior art technique of selecting the various test modes during the testing of a chip is to allocate n terminals on the chip's package as test terminals. By using n terminals, $2^n$ bit combinations are possible. One of these bit combinations is used for selecting the normal operating mode, while the remaining $2^n-1$ bit combinations are available for selecting the various test modes (i.e., each selectable configuration of test circuits). In addition to using n test terminals to acquire $2^n-1$ test modes, this prior art method determines the current mode of the chip based on the signals currently being asserted on these test terminals at any given time. As a result, this prior art method requires a separate bit combination for each test mode. For example, in a device in which n=3, a first test mode that enables test circuit A may be assigned to "001" and a second test mode that enables test circuit B may be assigned to "010". If it is desired to simultaneously enable test circuit A and test circuit B, a third test mode is needed. Although this third test mode enables a combination of circuitry enabled by existing modes, a third bit combination, such as "011", is required to select this third test mode. Modes, such as this third mode, in which the enabled circuitry is a combination of the circuitry enabled by various other modes are referred to herein as "combination modes". Since the relationship of combination modes to bit combinations is exponential, bit combinations may be used up quickly. For example, if a test circuit C is added and it is desired to test the chip in all possible combinations of test circuits A, B, and C, 7 bit combinations are required.

A problem with this prior art method is the number of terminals it requires. Many complex circuits, microprocessors for example, already require a significant number of terminals for normal operation, making the addition of terminals on their packages' expensive. At the same time, these complex circuits have a large number of test modes. As a result, this prior art method has the disadvantage of requiring several additional terminals as test terminals to support these test modes. Furthermore, it is likely that future circuits will require even more terminals for normal operation, as well as requiring even more test modes.

Another prior art technique uses higher than normal voltages on certain terminals to select a test mode. See U.S. Pat. No. 4,153,933. A problem with this technique is its requirement for special circuitry to serve the higher than normal voltage.

SUMMARY

A method for selecting test modes of an integrated circuit is provided. According to one aspect of the invention, a serial stream of digital signals comprising a number of predetermined patterns is applied to the integrated circuit. The integrated circuit identifies the patterns in the serial stream of digital signals and selects the test modes based upon the identified patterns. According to another aspect of the present invention, the patterns each contain n bits and are selected such that when transitioning from one of the patterns to another of the patterns in the serial stream of bits, none of the patterns are present in an n bit window. According to another aspect of the present invention, each occurrence of each pattern in the serial stream of bits is immediately preceded and followed by an inactive pattern. According to another aspect of the present invention, the test modes are also selected based upon the mode the integrated circuit is currently operating in.

According to another aspect of the present invention, an apparatus for selecting test modes of an integrated circuit is provided. The apparatus generally includes a first circuit for serially receiving a serial stream of digital signals comprising a plurality of predetermined patterns. The first circuit is coupled to a second circuit which identifies the patterns in said serial stream of digital signals and selects the test modes based on the identified patterns. According to another aspect of the present invention, the patterns each contain n bits and are selected such that when transitioning from one of the patterns to another of the patterns in the serial stream of bits, none of the patterns is present in an n bit window. According to another aspect of the present invention, each occurrence of each pattern in the serial stream of bits is immediately preceded and followed by an inactive pattern. According to another aspect of the present invention, the test modes are also selected based upon the mode the integrated circuit is currently operating in.

BRIEF DESCRIPTION OF THE DRAWINGS

The invention may best be understood by referring to the following description and accompanying drawings which illustrate the invention. In the drawings.

DETAILED DESCRIPTION

In the following description, numerous specific details are set forth to provide a thorough understanding of the present invention. However, it is understood that the present invention may be practiced without these specific details. In other instances, well-known circuits, structures and techniques have not been shown in detail in order not to unnecessarily obscure the present invention.

Although a more detailed explanation will be provided below, it is thought worthwhile to first provide a brief overview of the present invention. This application describes a method and apparatus for reducing the number of terminals on a chip's package required for selecting modes. To accomplish this, the present invention allows for the selection of modes by decoding a portion of a string of bits (or bit stream) which is serially shifted into a shift register through a single test terminal. This shift register acts as an n bit window into the string of bits. In one embodiment, the contents of the shift register are decoded using a set of predetermined patterns (each containing n bits) determined such that when transitioning from one of these patterns to another of these patterns in the string of bits, none of these patterns are present in the n bit window during the transitioning. This set of predetermined patterns can contain up to $2^{n-2}$ (for n>2) patterns, each of which may be used to select a different mode (including the normal operating mode). As a result, this embodiment uses only the single test terminal. In another embodiment, a second test terminal is used to indicate when the contents of the shift register should be decoded. As a result, the set of patterns used in this embodiment can contain up to $2^n$ patterns, each of which may be used to select a different mode (including the normal operating mode). In addition, each embodiment's number of selectable modes may be further increased, without increasing the number of required test terminals, by allowing for the selection of modes based not only on the portion of the string of bits currently stored in the shift register, but also on the chip's current mode. In this manner, the present invention may be implemented such that it does not require separate patterns to select combination modes.

Figure 1A:
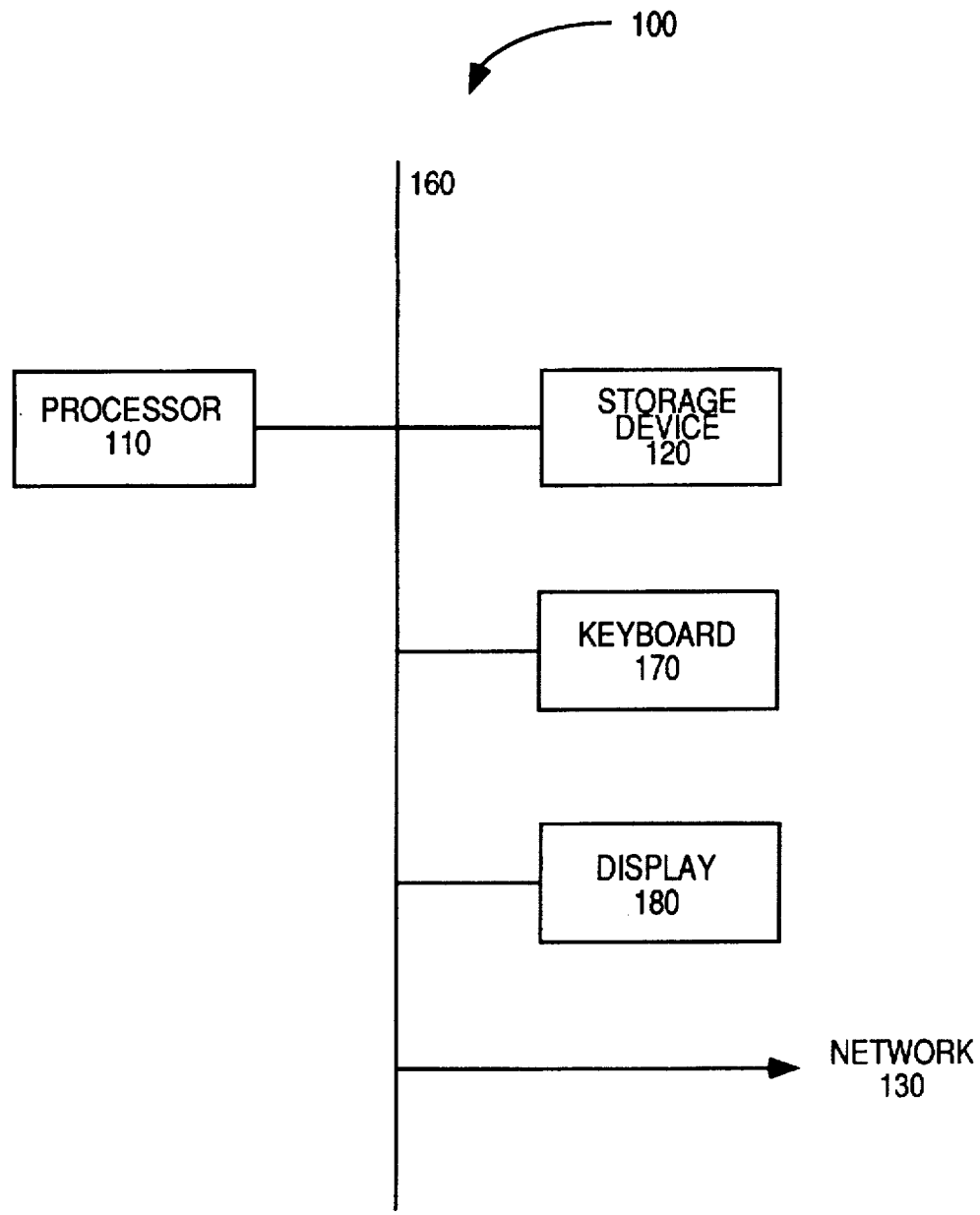
FIG. 1a illustrates an exemplary computer system incorporating the teachings of the present invention.

Referring now to FIG. 1a, a block diagram illustrating an exemplary computer system 100 incorporating the teachings of the present invention is shown. The exemplary computer system comprises a processor 110, a storage device 120, a network 130, and a bus 160. Processor 110 is coupled to storage device 120 and network 130 by bus 160. In addition, a number of user input/output devices, such as a keyboard 170 and a display 180, are also coupled to bus 160. Processor 110 has a normal operating mode and at least one test mode. Storage device 120 represents one or more mechanisms for storing data. For example, storage device 120 may include read only memory (ROM), random access memory (RAM), and/or a magnetic disk storage medium.

Figure 1B:
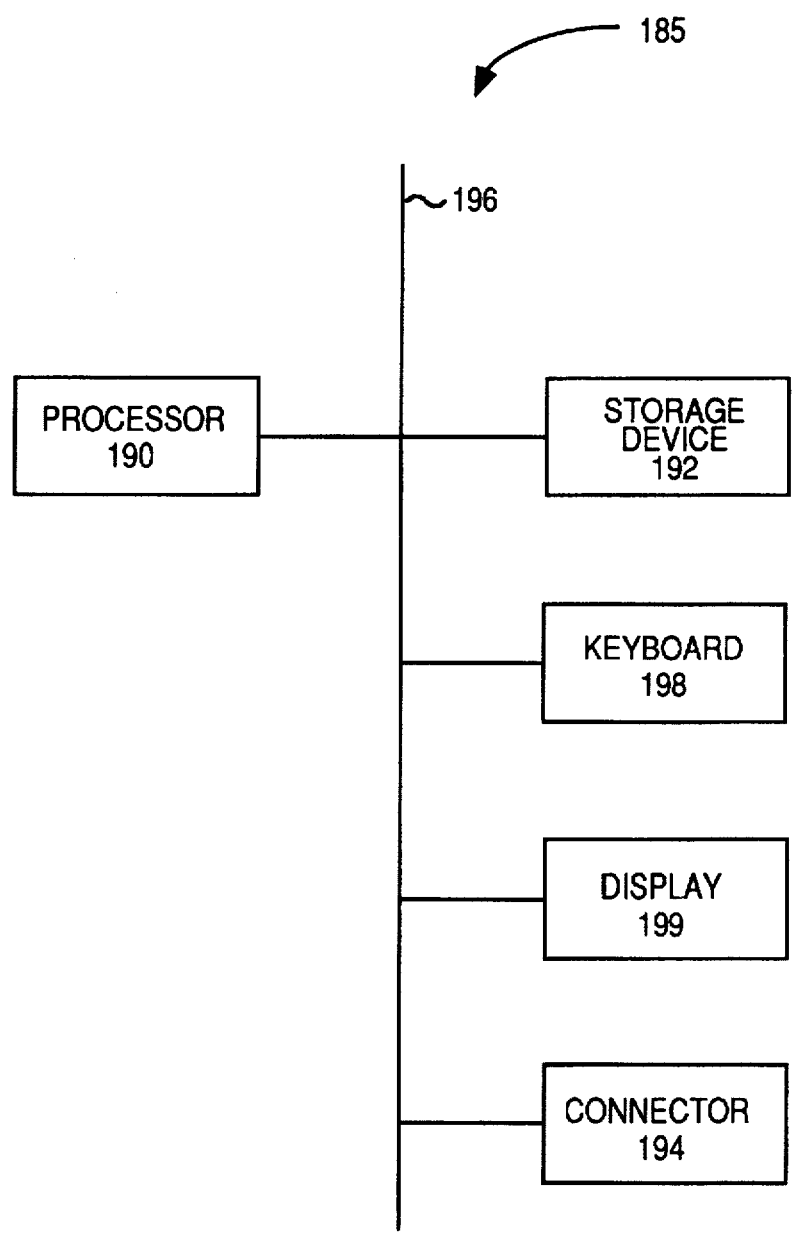
FIG. 1b illustrates an exemplary testing machine according to one embodiment of the present invention.

Referring now to FIG. 1b, a block diagram illustrating an exemplary testing machine 185 is shown. The exemplary testing machine includes a processor 190, a storage device 192, a connector 194, and a bus 196. Processor 190 is coupled to storage device 192 and connector 194 by bus 196. In addition, a number of user input/output devices, such as a keyboard 198 and a display 199, are also coupled to bus 196. Storage device 192 represents one or more mechanisms for storing data. For example, storage device 192 may include read only memory (ROM), random access memory (RAM), and/or a magnetic disk storage medium. Connector 194 represents a mechanism for connecting an electronic device, such as processor 110, to the exemplary test machine for testing.

While embodiments will be described in which the present invention is contained in processor 110, the present invention could be formed and used in any electronic device. Additionally, while embodiments will be described in which processor 110 has a normal operating mode, a first test mode which enables a first test circuit, a second test mode which enables a second test circuit, and a third test mode which simultaneously enables both the first and second test circuits, the present invention could be used in a chip with any number of modes and any number of test circuits.

One Embodiment of the Present Invention

Figure 2:
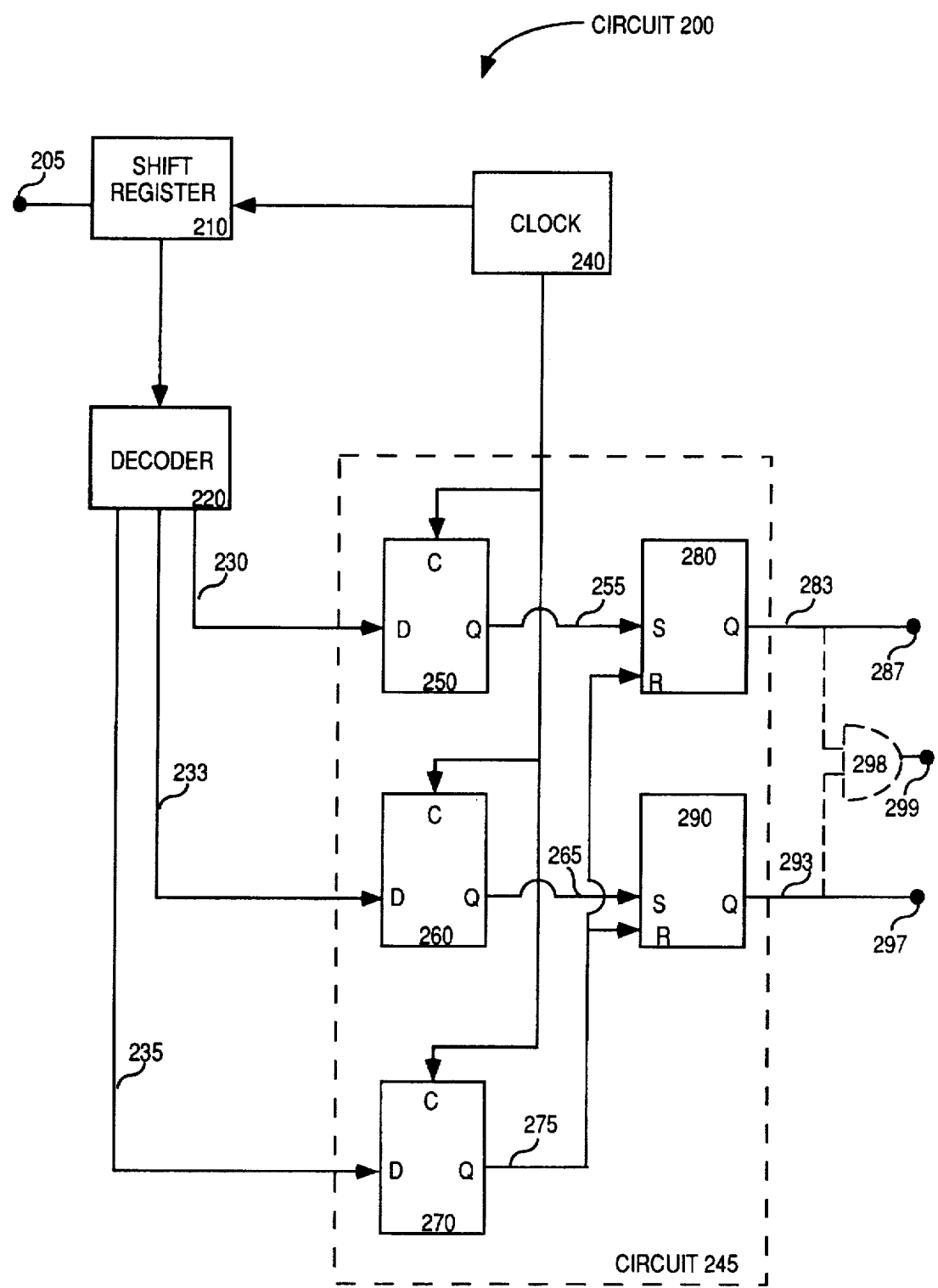
FIG. 2 illustrates a block diagram of one embodiment of the present invention.

Referring to FIG. 2, a block diagram of one embodiment of the present invention is illustrated. FIG. 2 shows circuit 200 containing a shift register 210, a decoder 220, a clock 240, and a circuit 245. Shift register 210 is coupled to an input node 205, which in turn is coupled to a test terminal (not shown) of processor 110. This test terminal is the only dedicated terminal that must be added for this embodiment to function. Driven by clock 240, circuit 200 serially shifts a string of bits asserted on input node 205 into shift register 210. As a result, shift register 210 stores the most recently received portion of this string of bits. Decoder 220 is coupled to shift register 210 for continuously decoding the most recently received portion of the string of bits stored in shift register 210 by determining if it contains one of a set of patterns. Each pattern in this set of patterns has a corresponding signal. If decoder 220 determines the contents of the shift register contains one of the patterns in this set of patterns, it transmits that pattern's corresponding signal. Decoder 220 is also coupled to line 230, line 233, and line 235 for transmitting a first decoded signal, a second decoded signal, and a reset signal, respectfully. As an example, if pattern "1001" corresponds to the first decoded signal and shift register 210 contains "1001", decoder 220 transmits the first decoded signal on line 230.

Circuit 245 is coupled to decoder 220 by line 230, line 233, and line 235. Circuit 245 is also coupled to a line 283, which ends in an output node 287, and a line 293, which ends in an output node 297. In response to receiving the first decoded signal from decoder 220 on line 230, circuit 245 asserts the first decoded signal at output node 287 and maintains that signal until the reset signal is received on line 235. In response to receiving the second decoded signal from decoder 220 on line 233, circuit 245 asserts the second decoded signal at output node 297 and maintains that signal until it receives the reset signal. When circuit 245 is asserting only the first decoded signal at output node 287, processor 110 operates in the first test mode it enables the first test circuit). In contrast, when circuit 245 is asserting only the second decoded signal at output node 297, processor 110 operates in the second test mode (i.e., it enables the second test circuit). However, when circuit 245 is asserting both the first decoded signal at output node 287 and the second decoded signal at output node 297, processor 110 operates in the third test mode (i.e., it simultaneously enables both the first and second test circuits). Therefore, circuit 245 allows for the selection of test modes without requiring each test mode to have a separate pattern. In response to receiving the reset signal from decoder 220 on line 235, circuit 245 de-asserts both the first decoded signal at output node 287 and the second decoded signal at output node 297, and processor 110 operates in its normal operating mode. Circuit 245 is also coupled to clock 240.

FIG. 2 also shows circuit 200 could additionally include an "AND" gate 298. The inputs of AND gate 298 connected to line 283 and line 293, while the output of AND gate 298 being asserted at a node 299. In this manner, the third test mode could also include additional test circuits.

As shown in FIG. 2, circuit 245 includes a D flip-flop 250, a D flip-flop 260, a D flip-flop 270, a set/reset flip-flop 280, and a set/reset flip-flop 290. The data input of D flip-flop 250 is coupled to line 230 for receiving the first decoded signal, the data input of D flip-flop 260 is coupled to line 233 for receiving the second decoded signal, and the data input of D flip-flop 270 is coupled to line 235 for receiving the reset signal. The control input of D flip-flop 250, D flip-flop 260, and D flip-flop 270 is coupled to clock 240. The output of D flip-flop 250 is coupled to the set input of set/reset flip-flop 280, the output of D flip-flop 260 is coupled to the set input of set/reset flip-flop 290, and the output of D flip-flop 270 is coupled to the reset input of both set/reset flip-flop 280 and set/reset flip-flop 290. The output of set/reset flip-flop 280 is coupled to line 283, while the output of set/reset flip-flop 290 is coupled to line 293. While one embodiment has been described in which circuit 245 is comprised of D type flip-flops and set/reset flip-flops, alternative embodiments could implement circuit 245 in any number of ways.

While the overall operation of circuit 200 will be described with reference to FIG. 3, it is thought worthwhile to first describe a method by which a set of patterns for use by decoder 220 may be determined. Since circuit 200 is constantly shifting in the string of bits, decoder 220 is constantly decoding the most recently received portion (i.e., the n bit window into the string of bits stored shift register 210). As a result, a set of patterns in which an occurrence of one of its patterns in a string of bits requires the occurrence of another of its patterns in the string bits cannot be used. For example, if "1111", "0000", and "0111" are selected as the first, second, and third patterns, transitioning from the first pattern to the second pattern (e.g., "0000<u>1111</u>") requires the occurrence of the third pattern (as indicated by the underlining). If these patterns are used, it will be impossible to transition from the first pattern to the second pattern without simultaneously selecting the mode corresponding to the third pattern. Thus, 1 the set of patterns used by decoder 220 is determined such that the occurrence of one of the patterns in the string of bits does not require the occurrence of another one of the patterns in the string of bits (such set of patterns is referred to herein as a "set of separable patterns"). Therefore, a method for determining a set of separable patterns is required. For a shift register that can store n bits such that the set of potential patterns contains $2^n$ patterns, one such method is:

1) Select a pattern from the set of potential patterns to be used as the home pattern. This home pattern is inserted in the string of bits immediately preceding and following each occurrence of each pattern in the set of separable patterns to prevent the unwanted occurrence in that string of bits of any of the other patterns in that set of separable patterns. The decoder does not react to the home pattern, and thus the home pattern is a non-responsive, inactive, or marker pattern. To provide an example, the pattern "0000" may be used if n=4.

2) Select one of the remaining patterns in the set of potential patterns as a reset pattern. The reset pattern is used for resetting the processor to the normal operating mode. In the present example, the pattern "1111" is a convenient pattern because input node 205 may be coupled to a default pullup resistor (not shown) such that it is tied to logic 1 unless driven. Therefore, processor 110 will not accidentally enter any test modes.

3) Determine the reset pattern's transitionary set. A pattern's transitionary set contains those patterns which must be contained in a string of bits if that string of bits contains that pattern immediately proceeded and followed by the home pattern. In the present example, a string of bits containing the selected reset pattern immediately proceeded and followed by the home pattern (i.e., a string of bits containing "000011110000") also contains patterns "0001", "0011", "0111", "1110", "1100", and "1000". As a result, these patterns comprise the transitionary set for the reset pattern "1111".

4) Remove the reset pattern, the patterns in the reset pattern's transitionary set, and the home pattern from the set of potential patterns. In the present example, the set of potential pattern is reduced to [0010, 0100, 0101, 0110, 1001, 1010, 1011, 1101].

5) Determine the transitionary set for each of the patterns remaining in the set of potential patterns. Note that these transitionary sets do not include patterns already excluded or chosen above. In the present example, Table 1 shows the remaining patterns in the set of potential patterns and their corresponding transitionary sets.

6) Determine the frequency of occurrence in the transitionary sets determined in step 5 for each pattern remaining in the set of potential patterns. As an example, pattern "0101" from Table 1 is contained in the transitionary set of both patterns "1010" and "1011". As a result, the frequency of occurrence for pattern "0101" is 2. Table 1 also shows the frequency of occurrence for each pattern.

7) Select one of the remaining patterns in the set of potential patterns that has the smallest frequency of occurrence to be added to the set of separable patterns to be used by decoder 220. In the present example, this would be one of patterns "1001", "1011", and "1101".

8) Remove the pattern selected in step 7 from the set of possible patterns and from the remaining transitionary sets. Assuming pattern "1001" was selected in step 7 as a first test pattern, the remaining patterns are shown in Table 2.

9) Repeat steps 7 through 8 using the patterns remaining in the set of potential patterns if additional patterns are required for the set of separable patterns. Assuming pattern "1011" is selected as a second test pattern, the remaining patterns are shown in Table 3. Thus, in the present example, the selected set of separable patterns is [1111,1001,1101]. Since the circuit will react to these patterns, they are responsive of active patterns.

Using this method, there is an exponential relationship between the size of the shift register and the number of available active patterns: an n bit shift register provides for $2^{(n-2)}$ active patterns. This yields $2^{(n-2)}$ selectable modes, not counting any combination modes not requiring separate patterns. Thus, for n=4, 5, and 6, there are 4, 8, and 16 active patterns, respectively.

TABLE 1

| SET OF POSSIBLE PATTERNS | TRANSITIONARY SETS | FREQUENCY OF OCCURRENCE |
| --- | --- | --- |
| 1001 | 0010, 0100 | 0 |
| 1011 | 0010, 0101, 0110 | 0 |
| 1101 | 0100, 0110, 1010 | 0 |

TABLE 1-continued

| SET OF POSSIBLE PATTERNS | TRANSITIONARY SETS | FREQUENCY OF OCCURRENCE |
|---|---|---|
| 0101 | 0010, 0100, 1010 | 2 |
| 0110 |  | 2 |
| 1010 | 0010, 0100, 0101 | 2 |
| 0010 | 0100 | 5 |
| 0100 | 0010 | 5 |

TABLE 2

| SET OF POSSIBLE PATTERNS | TRANSITIONARY SETS | FREQUENCY OF OCCURRENCE |
|---|---|---|
| 1011 | 0101, 0110 | 0 |
| 1101 | 0110, 1010 | 0 |
| 0101 | 1010 | 2 |
| 0110 |  | 2 |
| 1010 | 0101 | 2 |

TABLE 3

| SET OF POSSIBLE PATTERNS | TRANSITIONARY SETS | FREQUENCY OF OCCURRENCE |
|---|---|---|
| 1101 | 1010 | 0 |
| 1010 |  | 1 |

Figure 3:
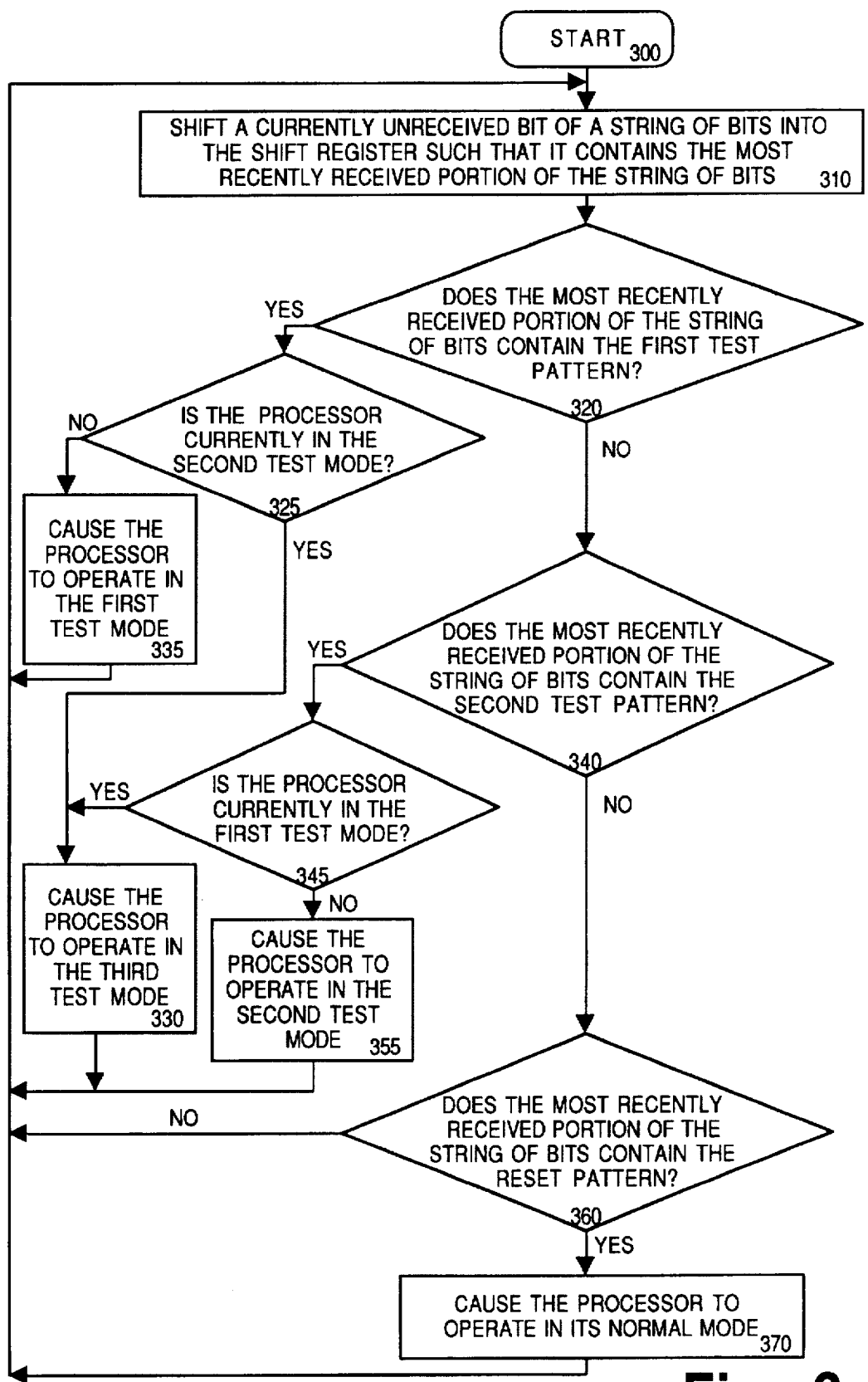
FIG. 3 illustrates a flow diagram of the operation of one embodiment of the present invention.

Referring now to FIG. 3, a flow diagram of the operation of circuit 200 will be described starting at step 300. From step 300, flow passes to step 310. To provide an example, it is assumed that the first test pattern "1001" corresponds to the first test mode and the second test pattern "1011" corresponds to the second test mode. In addition, it is assumed processor 110 is operating in its normal operating mode. Furthermore, it is assumed that the string of bits is "000011110000101100010010000" and that the underlined portion of this string of bits has already been shifted into shift register 210. As a result, the unreceived remainder of the string of bits is "0000111100001011000001001" and the most recently received portion of the string of bits is "0000". This string of bits contains the first test pattern, the second test pattern, and the reset pattern.

At step 310, a currently unreceived bit of the string of bits is shifted into the shift register such that it contains the most recently received portion of the string of bits. From step 310, flow passes to step 320. In the present example, "00001111000010110000100<u>1</u>" is the next unreceived bit and it is shifted into shift register 210 in response to clock 240. As a result, the unreceived remainder of the string of bits is now "000011110000101100000100" and the most recently received portion (i.e., the contents of shift register 210) is "1000".

As shown in step 320, it is determined whether the most recently received portion of this string of bits contains the first test pattern. If the most recently received portion contains the first test pattern, flow passes to step 325. Otherwise, flow passes to step 340. This is accomplished by having decoder 220 decode the most recently received portion of the string of bits stored in shift register 210 into the first decoded signal if the most recently received portion contains the first test pattern. In the present example, the most recently received portion "1000" does not contain the first test pattern "1001" and flow passes to step 340.

At step 340, it is determined whether the most recently received portion of the string of bits contains the second test pattern. If so, flow passes to step 345. Otherwise, flow passes to step 360. This is accomplished by having decoder 220 decode the most recently received portion of the string of bits stored in shift register 210 into the second decoded signal if the most recently received portion contains the second test pattern. In the present example, the second test pattern "10<u>1</u>1" is not contained in the most recently received portion "1000" and flow passes to step 360.

At step 360, the determination is made whether the most recently received portion of the string of bits contains the reset pattern. If so, flow passes to step 370. Otherwise, flow passes back to step 310. This is accomplished by having decoder 220 decode the most recently received portion of the string of bits stored in shift register 210 into the reset signal if the most recently received portion contains the reset pattern. In the present example, the most recently received portion "1000" does not contain the reset pattern "1111" and flow passes back to step 310.

In the present example, flow will continue through steps 310, 320, 340 and 360 as previously described until the last bit of the first test pattern contained in the string of bits is the next bit to be shifted into shift register 210. Therefore, this description will skip forward to the point where the unreceived remainder of the string of bits is "0000111100001011000001" and the most recently received portion is "0010".

At step 310, the next unreceived bit of the string of bits is shifted into the shift register such that it contains the most recently received portion of the string of bits. From step 310, flow passes to step 320. In the present example, the next unreceived bit is shifted into shift register 210 such that the unreceived remainder of the string of bits becomes "000011110000101110000" and the most recently received portion of the string of bits becomes "1001".

At step 320, the determination is made whether the most recently received portion of the string of bits contains the first test pattern. If so, flow passes to step 325. Otherwise flow passes to step 340. In the present example, the most recently received portion "1001" contains the first test pattern "1001". As a result, decoder 220 generates the first decoded signal on line 230 and flow passes to step 325.

As shown in step 325, the determination is made whether the processor is currently in the second test mode. If so, flow passes to step 330. Otherwise flow passes to step 335. In the present example, the processor is currently in the normal operating mode and flow passes to step 335.

As shown in step 335, the processor is set to operate in the first test mode. From step 335, flow passes back to step 310. In the present example, the first decoded signal generated by decoder 220 in step 320 is received at the data input of D flip-flop 250. In response to receiving logic 1 from clock 240, D flip-flop 250 becomes transparent and begins transmitting the first decoded signal on line 255 to the set input of set/reset flip-flop 280. In response to receiving the first decoded signal at its set input, set/reset flip-flop 280 begins transmitting the first decoded signal on line 283 to output node 287. Set/reset flip-flop 280 will maintain the first decoded signal until receiving the reset signal at its reset input. Processor 110, in response to receiving the first decoded signal at output node 287, begins operating in the first test mode.

In the present example, flow will again continue through steps 310, 320, 340 and 360 as previously described until the last bit of the second test pattern contained in the string of bits is the next bit to be shifted into shift register 210. Therefore, this description will skip forward to the point where the unreceived portion of the string of bits is "0000111100001" and the most recently received portion is "0110".

At step 310, the next unreceived bit of the string of bits is shifted into the shift register such that it contains the most recently received portion of the string of bits. From step 310, flow passes to step 320. In the present example, the next unreceived bit is shifted into shift register 210 such that the unreceived portion of the string of bits becomes "000011110000" and the most recently received portion of the string of bits becomes "1011".

As shown in step 320, the determination is made whether the most recently received portion of the string of bits contains the first test pattern. If so, flow passes to step 325. Otherwise, flow passes to step 340. In the present example, the most recently received portion "1011" does not contain the first test pattern "1001" and flow passes to step 340.

At step 340, the determination is made whether the most recently received portion of the string of bits contains the second test pattern. If so, flow passes to step 345. Otherwise, flow passes to step 360. In the present example, the most recently received portion "1011" contains the second test pattern "1011". As a result, decoder 220 generates the second decoded signal on line 233 and flow passes to step 345.

At step 345, the determination is made whether the processor is currently in the first test mode. If so, flow passes to step 330. Otherwise, flow passes to step 355. In the present example, the first decoded signal is being asserted at output node 287 and, thus, processor 110 is in the first test mode. As a result, flow passes to step 330.

At step 330, the processor is caused to operate in the third test mode. From step 330, flow passes back to step 310. In the present example, the second decoded signal generated by decoder 220 in step 340 is received at the data input of D flip-flop 260. In response to receiving a logic 1 from clock 240, D flip-flop 260 becomes transparent and begins transmitting the second decoded signal on line 265 to the set input of set/reset flip-flop 290. In response to receiving the second decoded signal at its set input, set/reset flip-flop 290 begins transmitting the second decoded signal on line 293 to output node 297. Set/reset flip-flop 290 will maintain the second decoded signal until receiving the reset signal at its reset input. As a result, circuit 200 is simultaneously asserting the first decoded signal and the second decoded signal. Processor 110, in response to simultaneously receiving both the first decoded signal at output node 287 and the second decoded signal at output node 297, begins operating in the third test mode. As can be seen from this example, rather then selecting the mode of processor 110 based solely on decoding the contents of shift register 210, the mode of processor 110 is selected based on both the current mode of processor 110 and contents of shift register 210. As a result, this embodiment does not require a separate pattern for each test mode.

In the present example, flow will continue through steps 310, 320, 340 and 360 as previously described until the last bit of the reset pattern contained in the string of bits is the next bit to be shifted into shift register 210. Therefore, this description will skip forward to the point where the unreceived portion of the string of bits is "00001" and the most recently received portion is "1110".

As shown in step 310, the next unreceived bit of the string of bits is shifted into the shift register such that it contains the most recently received portion of the string of bits. From step 310, flow passes to step 320. In the present example, the next unreceived bit is shifted into shift register 210 such that the unreceived portion of the string of bits becomes "0000" and the most recently received portion of the string of bits becomes "1111".

In the present example, flow will pass through steps 320 and 340 to step 360 as previously described. At step 360, the determination is made whether the most recently received portion of the string of bits contains the reset pattern. If so, flow passes to step 370. Otherwise flow passes to step 310. In the present example, the most recently received portion "1111" contains the reset pattern "1111" and flow passes to step 370. As a result, decoder 220 generates the reset signal on line 275 and flow passes to step 370.

At step 370, the processor is caused to operate in its normal operating mode and flow passes back to step 310. In the present example, the reset signal generated by decoder 220 in step 360 is received at the data input of D flip-flop 270. In response to receiving logic 1 from clock 240, D flip-flop 270 becomes transparent and begins transmitting the reset signal on line 275 to the reset input of both set/reset flip-flop 280 and set/reset flip-flop 290. In response to receiving the reset signal at their reset inputs, set/reset flip-flop 280 and set/reset flip-flop 290 are reset such that they no longer transmit the first decoded signal and the second decoded signal, respectively. As a result, processor 110 will switch from operating in the third test modes to the operating in the normal operating mode.

It is thought worthwhile to describe step 355 which was not covered by the previous example. At step 345, the determination is made whether the processor is in the first test mode. If so, flow passes to step 330. Otherwise, flow passes to step 355. Assuming the first decoded signal is not being asserted at output node 287, processor 110 is in its normal operating mode and flow passes to step 355. At step 355, the processor is caused to operate in the second test mode and flow passes back to step 310. To accomplish this, the second decoded signal is asserted at output node 297 as previously described with reference to step 330.

Thus, when processor 110 is used in exemplary computer system 100, shift register 210 receives all 1s such that processor 110 is in the normal operating mode. However, when processor 110 is placed in exemplary testing machine 185, a string of bits may be asserted on the test terminal which causes processor 110 to operate in its various test modes. This string of bits should repeat the home pattern once the desired test mode has been selected and include an occurrence of the reset pattern prior to selecting a test mode which does not build on the current mode of processor 110. In this manner, processor 110 may be made to operate in the first test mode, the second test mode, the third test mode, or the normal operating mode using only one test terminal.

While this embodiment has been described in relation to a chip with 4 modes, alternative embodiments could have any number of modes without requiring additional test terminals by increasing the capacity of the described circuits (e.g., increasing the capacity of circuit 200 so that it could support patterns of the required number of bits).

Another Embodiment of the Present Invention

Having described an embodiment of the present invention, another embodiment will now be described. Like the previous embodiment, this embodiment allows for the selection of test modes by decoding a portion of a string of bits which is serially shifted into a shift register through a single test terminal. However, unlike the previous embodiment, this embodiment uses a second test terminal to indicate when the decoder should decode the contents of the shift register. Therefore, the decoder is not constantly decoding the contents of the shift register and the set of patterns used by the decoder need not be a set of separable patterns. Thus, at the cost of one additional test terminal, this embodiment provides $2^n$ patterns which may be used for selecting modes. As a result, $2^n$ selectable modes (not counting any combination modes not requiring separate patterns) are provided. Preferably, one of these patterns is used for the normal operating mode, while the remaining patterns are used for test modes.

Figure 4:
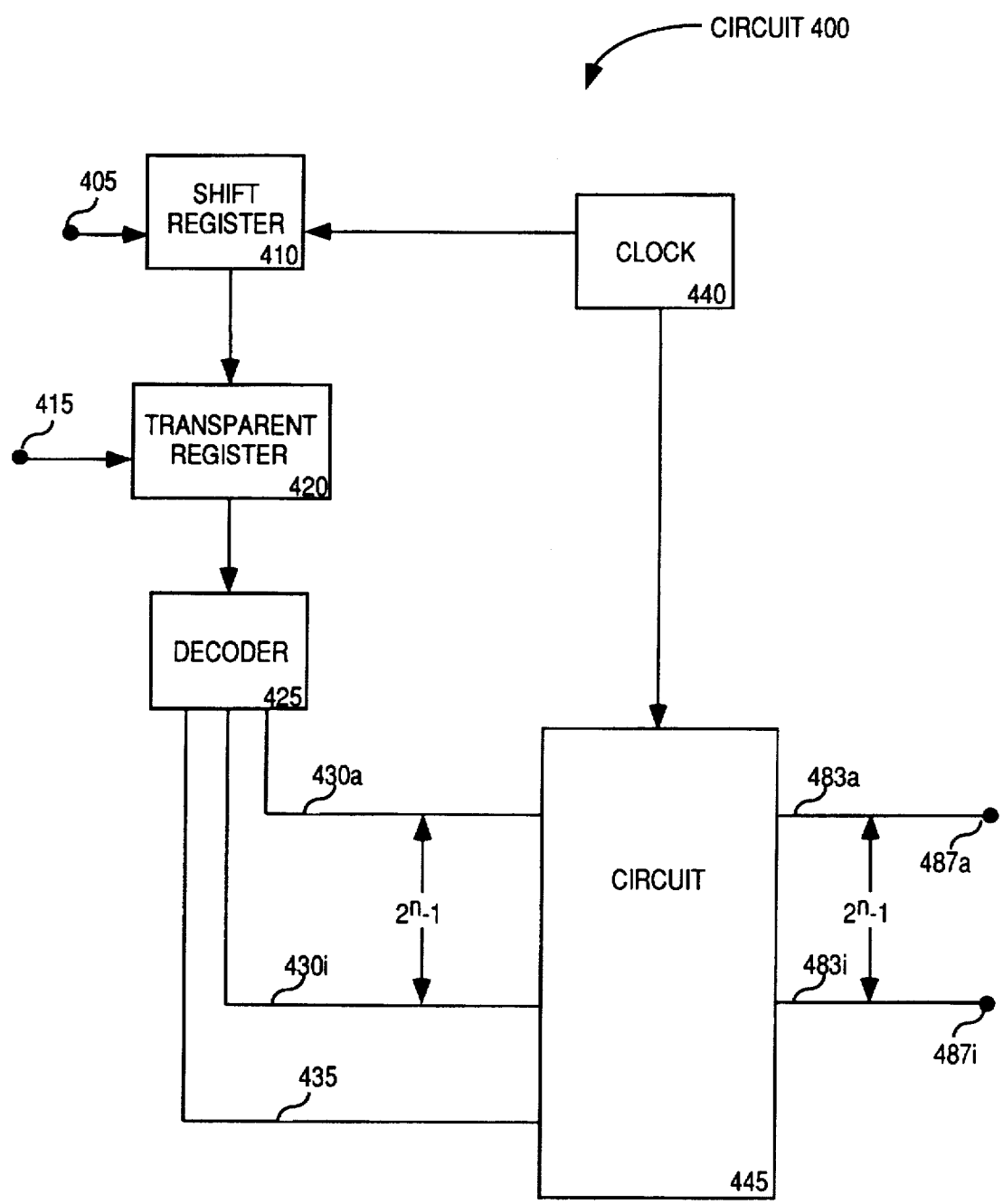
FIG. 4 illustrates a block diagram of another embodiment of the present invention.

Referring to FIG. 4, a block diagram of one embodiment of the present invention is illustrated. FIG. 4 shows circuit 400 containing a shift register 410, a transparent register 420, a decoder 425, a clock 440, and a circuit 445. Shift register 410 is coupled to an input node 405, which in turn is coupled to a first test terminal (not shown) of processor 110. Driven by clock 440, circuit 400 serially shifts a string of bits asserted on input node 405 into shift register 410. As a result, shift register 410 stores the most recently received portion of this string of bits. Transparent register 420 is coupled to input node 415, which in turn is coupled to a second test terminal (not shown) of processor 110. Transparent register 420 is also coupled to shift register 410 for storing, in response to a signal being asserted on the second test terminal, the most recently received portion of the string of bits stored in shift register 410. Decoder 425 is coupled to transparent register 420 for decoding the portion of the string of bits stored in transparent register 420 by determining if it contains one of a set of patterns. Each pattern in the set of patterns used by decoder 425 has a corresponding signal. If decoder 425 determines the transparent register 420 contains one of the patterns in this set of patterns, it transmits that pattern's corresponding signal.

Thus, decoder 425 only decodes those portions of the string of bits which are stored in transparent register 420 in response to a signal being asserted on the second test terminal. Therefore, if a signal is asserted on the second test terminal only when patterns contained in the set of pattern used by decoder 425 are stored in shift register 410, what precedes or follows these patterns in the string of bits is irrelevant. As a result, the set of patterns used by decoder 425 can be any patterns in the set of $2^n$ patterns.

Decoder 425 is also coupled to lines 430a–i (representing up to $2^n-1$ lines) each for transmitting a corresponding decoded signal. As an example, if pattern "1001" corresponds to the first decoded signal and shift register 410 contains "1001", decoder 425 transmits the first decoded signal on line 430a. In addition, decoder 420 is coupled to line 435 for transmitting a reset signal.

Circuit 445 operates in the same manner as circuit 245. Circuit 445 is coupled to decoder 425 by lines 430a–i and line 435. Circuit 445 is also coupled to lines 483a–i which end in corresponding output nodes 487a–i. In response to receiving the first decoded signal from decoder 425 on line 430, circuit 445 asserts the first decoded signal at output node 487 and maintains that signal until the reset signal is received. In response to receiving the second decoded signal from decoder 425 on line 433, circuit 445 asserts the second decoded signal at output node 497 and maintains that signal until it receives the reset signal. When circuit 445 is asserting only the first decoded signal at output node 487a, processor 110 operated in the first test mode (i.e., it enables the first test circuit). When circuit 445 is asserting only the second decoded signal at output node 487b, processor 110 operates in the second test mode (i.e., it enables the second test circuit). When circuit 445 is asserting both the first decoded signal at output node 487a and the second decoded signal at output node 487b, processor 110 operates in the third test mode (i.e., it simultaneously enables both the first and second test circuits). Therefore, circuit 445 allows for the selection of test modes without requiring each test mode to have a separate pattern. In response to receiving the reset signal from decoder 425 on line 435, circuit 445 de-asserts both the fast decoded signal at output node 487a and the second decoded signal at output node 487b, and processor 110 operates in its normal operating mode. Circuit 445 is also coupled to clock 440. Circuit 400 could also include AND gates as previously described with reference to FIG. 2.

While this embodiment has been described in relation to a chip with 4 modes, alternative embodiments could have any number of modes without requiring additional test terminals by increasing the capacity of the described circuits (e.g., increasing the capacity of circuit 400 so that it could support patterns of the required number of bits).

Another Embodiment of the Present Invention

Having described several embodiments of the present invention, another embodiment will now be described. Unlike the previous embodiment, this embodiment uses a parallel register coupled to n test terminals for receiving and storing information for use in selecting modes for processor 110. However, like the previous embodiments this embodiment allows for the selection of test modes based on the current mode of processor 110 by using an additional test terminal to indicate when the decoder should decode the contents of the parallel register and a circuit similar to circuit 245. Therefore, this embodiment allows for the use of $2^n$ bit combinations to select modes and does not require bit combinations be used to select combination modes.

Alternative Embodiments

While the present invention has been described in relation to a chip having a normal operating mode and at least one test mode, other electronic devices which have several "normal" operating modes to be used for different applications could utilize the present invention. Therefore, the present invention is not limited to the selection of test modes of an electronic device. In addition, while the present invention has been described in relation to circuits which select the current mode of a chip using both the contents of a register and the current mode of the chip, alternative embodiments could be implemented such that they select some or all of the test modes based solely on the contents of that register. Such an embodiment could be implemented by having each pattern's corresponding signal, in addition to enabling its corresponding mode, disable all other modes.

While the present invention has been described in terms of several embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. A method for selecting a plurality of test modes in an integrated circuit comprising:
 receiving at an input of said integrated circuit a bit stream, said bit stream containing a set of predetermined bit patterns each of n bits, each of said bit patterns corresponding to one of said test modes, said bit patterns being selected such that when transitioning from one of said bit patterns to another of said bit patterns in said bit stream none of said bit patterns is present in an n bit window during said transitioning;
 identifying at least one of said bit patterns in said bit stream; and
 selecting the one of said test modes corresponding to said identified bit pattern.

2. A method for selecting a plurality test modes in an integrated circuit comprising:

applying to said integrated circuit a serial stream of digital signals comprising a plurality of predetermined active patterns, wherein each of said plurality of predetermined active patterns is immediately followed by and preceded by a predetermined inactive pattern;

recognizing at least two of said active patterns each representing a different one of said test modes; and recognizing at least another of said active patterns representing a reset condition for said test modes.

3. The method of claim 2 further comprising the step of:

selecting said plurality of test modes based on said recognized bit patterns and on which mode said integrated circuit is currently operating in.

4. The method of claim 2, wherein each of said patterns contains n bits and is determined such that when transitioning from one of said patterns to another of said patterns in said serial stream of digital signals none of said plurality of patterns is present in an n bit window during said transitioning.

5. A method for selecting from a plurality of test modes in an integrated circuit comprising the steps of:

selecting a string of bits such that each occurrence of each of a plurality of predetermined active patterns in said string of bits is immediately preceded and followed by a predetermined inactive pattern;

identifying said plurality of active patterns in said string of bits in response to serially applying said string of bits to said integrated circuit; and selecting from said plurality of test modes based on said identified active patterns.

6. The method of claim 5, wherein said step of selecting from said plurality of test modes is also based additionally on which mode said integrated circuit is currently operating in.

7. The method of claim 5, wherein said inactive pattern and each of said plurality of active patterns contains n bits and is determined such that when transitioning from one of said active patterns to another of said active patterns in said string of bits none of said plurality of active patterns is present in an n bit window during said transitioning.

8. An integrated circuit operable in a plurality of test modes, said integrated circuit comprising:

a first circuit for serially receiving a series of bit stream, said string of bits comprising a plurality of bit patterns each of n bits, said plurality of patterns being selected such that when transitioning from one of said bit patterns to another of said bit patterns in said series of bit stream none of said bit patterns is present in an n bit window during said transitioning; and a second circuit coupled to said first circuit for identifying said bit patterns in said series of bit stream and selecting said test modes based on said identified bit patterns.

9. The integrated circuit of claim 8, wherein said second circuit is further used for selecting said test modes based additionally on which mode said integrated circuit is currently operating in.

10. An integrated circuit operable in a plurality of modes, said integrated circuit comprising:

a first circuit for serially receiving a serial stream of digital signals comprising a plurality of predetermined patterns, said plurality of predetermined patterns including a plurality of active patterns and an inactive pattern, wherein each active pattern in said serial stream is immediately followed by and preceded by said inactive pattern, said plurality of active patterns including at least two patterns each representing a different one of said plurality of modes; and a second circuit coupled to said first circuit for identifying said plurality of predetermined patterns in said serial stream of digital signals and selecting each of said plurality of modes based on said identified active patterns.

11. The integrated circuit of claim 10, wherein said second circuit is further used for selecting said plurality of modes based on which mode said integrated circuit is currently operating in.

12. The integrated circuit of claim 10, wherein said second circuit is further used for receiving an enable signal and only selects which mode said integrated circuit is to operate in when said enable signal is being received.

13. The integrated circuit of claim 10, wherein each of said plurality of patterns contains n bits and is determined such that when transitioning from one of said patterns to another of said patterns in said serial stream of digital signals none of said plurality of patterns is present in an n bit window during said transitioning.

14. An integrated circuit operable in a plurality of test modes, said integrated circuit comprising:

a first circuit for serially receiving a string of bits, said string of bits being selected such that each occurrence of each of a plurality of predetermined active pattern is immediately preceded and followed by a predetermined inactive pattern;

a second circuit coupled to said first circuit for identifying said active patterns in said string of bits and selecting which mode said integrated circuit is to operate in based on said identified active patterns.

15. The integrated circuit of claim 14, wherein said second circuit is further used for selecting said test modes based additionally on which mode said integrated circuit is currently operating in.

16. The integrated circuit of claim 14, wherein said inactive pattern and each of said plurality of active patterns contains n bits and is determined such that when transitioning from one of said active patterns to another of said active patterns in said string of bits none of said plurality of active patterns is present in an n bit window during said transitioning.

17. The integrated circuit of claim 10, wherein at least one of said plurality of predetermined active patterns corresponds to a test mode.

18. An integrated circuit comprising:

a first input for receiving a clock signal;

a second input for receiving a serial stream of bits;

a circuit coupled to said first input and said second input for causing said integrated circuit to enter a plurality of modes based on said clock signal and a plurality of bit patterns in said serial stream of bits, wherein each of said plurality of bits patterns comprises at least two bits, and each of said plurality of bit patterns is followed by and preceded by an inactive bit pattern.

19. The integrated circuit of claim 18, wherein at least one of said plurality of bit patterns corresponds to a test mode.

20. The integrated circuit of claim 19, wherein said integrated circuit is contained in a processor.

21. The integrated circuit of claim 17, wherein said circuit further transitions between said plurality of modes based on a current one of said plurality of modes in which said integrated circuit is operating.

* * * * *

UNITED STATES PATENT AND TRADEMARK OFFICE
CERTIFICATE OF CORRECTION

PATENT NO. : 5,726,995
DATED : March 10, 1998
INVENTOR(S) : Keng L. Wong

It is certified that error appears in the above-identified patent and that said Letters Patent is hereby corrected as shown below:

In column 4 at line 56 insert --(i.e.,-- following "mode" and prior to "it"

Signed and Sealed this

Twenty-fifth Day of August, 1998

Attest:

BRUCE LEHMAN

*Attesting Officer*  *Commissioner of Patents and Trademarks*